United States Patent
Algreatly

(10) Patent No.: US 9,697,646 B2
(45) Date of Patent: *Jul. 4, 2017

(54) CONVERTING A 3D MODEL INTO MULTIPLE MATRICES

(71) Applicant: Cherif Atia Algreatly, Newark, CA (US)

(72) Inventor: Cherif Atia Algreatly, Palo Alto, CA (US)

(73) Assignee: Cherif Algratly, Palo Alto, CA (US)

(*) Notice: Subject to any disclaimer, the term of this patent is extended or adjusted under 35 U.S.C. 154(b) by 1034 days.

This patent is subject to a terminal disclaimer.

(21) Appl. No.: 13/935,491

(22) Filed: Jul. 5, 2013

(65) Prior Publication Data

US 2013/0321414 A1 Dec. 5, 2013

Related U.S. Application Data

(63) Continuation-in-part of application No. 12/462,715, filed on Aug. 7, 2009, now Pat. No. 8,543,902.

(51) Int. Cl.
*G06T 15/00* (2011.01)
*G06T 17/30* (2006.01)
*G06F 3/0484* (2013.01)
*G06F 17/50* (2006.01)
*G06F 17/00* (2006.01)

(52) U.S. Cl.
CPC .......... *G06T 17/30* (2013.01); *G06F 3/04845* (2013.01); *G06F 17/00* (2013.01); *G06F 17/50* (2013.01)

(58) Field of Classification Search
None
See application file for complete search history.

*Primary Examiner* — Xiao Wu
*Assistant Examiner* — Mohammad H Akhavannik

(57) ABSTRACT

A method is disclosed for converting a 3D model into multiple matrices to extract information related to the 3D model in an automated manner. The extracted information may represent numerical information such as lengths, areas, or volumes, or may represent positional information describing the location of the objects of the 3D model relative to each other. The extracted information may represent the identity of the objects of the 3D model, or the compliance of the 3D model against a set of rules, codes, or requirements. The method serves a variety of medical, engineering, architectural, industrial, and gaming applications.

20 Claims, 23 Drawing Sheets

|    | 1 | 2 | 3 | 4 | 5 | 6 | 7 | 8 | 9 | 10 |
|----|---|---|---|---|---|---|---|---|---|----|
| 1  |   |   |   |   |   |   |   |   |   |    |
| 2  |   |   |   |   | S | S | S |   |   |    |
| 3  |   |   |   | S |   |   |   | S |   |    |
| 4  |   |   | S |   |   |   |   |   | S |    |
| 5  |   | S |   |   |   |   | S | S | S |    |
| 6  |   | S |   |   |   |   | S |   |   |    |
| 7  |   | S |   |   |   |   | S | S | S |    |
| 8  |   |   | S |   |   |   |   |   | S |    |
| 9  |   |   |   | S | S |   | S | S |   |    |
| 10 |   |   |   |   |   | S |   |   |   |    |

FIG. 9

|    | 1 | 2 | 3 | 4 | 5 | 6 | 7 | 8 | 9 | 10 |
|----|---|---|---|---|---|---|---|---|---|----|
| 1  |   |   |   |   |   |   |   |   |   |    |
| 2  |   |   |   |   |   |   |   |   |   |    |
| 3  |   |   |   |   |   |   |   |   |   |    |
| 4  |   |   |   |   |   |   |   |   |   |    |
| 5  |   |   |   |   |   |   | C | C | C |    |
| 6  |   |   |   |   |   |   | C |   |   | C  |
| 7  |   |   |   |   |   |   | C | C | C | C  |
| 8  |   |   |   |   |   |   |   |   |   |    |
| 9  |   |   |   |   |   |   |   |   |   |    |
| 10 |   |   |   |   |   |   |   |   |   |    |

FIG. 10

|   | 1 | 2 | 3 | 4 | 5 | 6 | 7 | 8 | 9 | 10 |
|---|---|---|---|---|---|---|---|---|---|----|
| 1 |   |   |   |   |   |   |   |   |   |   |
| 2 |   |   |   |   | S | S | S |   |   |   |
| 3 |   |   |   | S |   |   |   | S |   |   |
| 4 |   |   | S |   |   |   |   |   | S |   |
| 5 |   | S |   |   |   |   | SC | SC | SC |   |
| 6 |   | S |   |   |   |   | SC |   |   | C |
| 7 |   | S |   |   |   |   | SC | SC | SC | C |
| 8 |   |   | S |   |   |   |   |   | S |   |
| 9 |   |   |   | S | S |   | S | S |   |   |
| 10|   |   |   |   |   | S |   |   |   |   |

FIG. 11

CONVERTING A 3D MODEL INTO MULTIPLE MATRICES

CROSS-REFERENCE TO RELATED APPLICATION

This application is a Continuation-in-Part of co-pending U.S. patent application Ser. No. 12/462,715, filed Aug. 7, 2009, titled "Converting A Drawing Into Multiple Matrices".

BACKGROUND

The patent application Ser. No. 12/462,715 discloses a method for converting a drawing into multiple matrices that enable extracting information related to the drawing or its objects in an automated manner. The prior art of the aforementioned patent application does not, in any detailed manner, disclose the method of converting a 3D model into multiple matrices to extract information related to the 3D model or its objects in an automated manner. Such automated extraction of information from a 3D model can serve a variety of medical, engineering, architectural, industrial, and gaming applications as will be described subsequently.

SUMMARY

The present invention discloses a method for converting a 3D model into multiple matrices. The 3D model can be represented by a variety of techniques such as the constructive solid geometry (CSG) technique; Non-Uniform Rational B-Spline (NURBS) modeling; polygonal modeling; or point cloud technique. The CSG technique is based on creating a 3D model for an object by combining or de-combining a set of simple objects such as spheres, cylinders, or cubes. The NURBS modeling technique is based on generating a plurality of curves to represent a freeform surface. The polygonal modeling technique is based on representing or approximating the surfaces of a 3D model using a collection of polygons. The point cloud technique is based on representing a 3D model by a set of data points in a coordinate system.

The present invention discloses a method for converting a 3D model into multiple matrices to extract information about the 3D model or its objects in an automated manner. In one embodiment of the present invention, the information extracted from the 3D model represents the identity of the 3D model or its objects. In another embodiment of the present invention, the information extracted from the 3D model represents numerical information such as dimensions, areas, or volumes related to the 3D model or its objects. In one embodiment of the present invention, the information extracted from the 3D model represents positional information describing the locations of the objects of a 3D model relative to each other. In yet another embodiment of the present invention, the extracted information represents checking the compliance of the 3D model against certain rules, codes, or requirements.

Accordingly, by using the present invention, it becomes possible to automate various tasks that were previously the sole domain of subject-matter-experts. Some examples are: aiding physicians in planning their medical surgeries in a structured and comprehensive manner; helping engineers to accurately analyze the structural designs of buildings against potential disasters such as earthquakes, hurricanes, or explosions; assisting architects in reaching optimized building designs according to the project's requirements or constraints; and serving software developers in creating more intelligent 3D virtual environments for real-life motion pictures or gaming applications.

BRIEF DESCRIPTION OF THE DRAWINGS

FIG. 9 illustrates an individual matrix representing the intersection points of the horizontal layer that carry the sphere's ID.

FIG. 10 illustrates an individual matrix representing the intersection points of the horizontal layer that carry the cylinder's ID.

FIG. 11 illustrates a collective matrix that combines the IDs of the sphere and the cylinder of the horizontal layer.

DETAILED DESCRIPTION

In one embodiment, the present invention discloses a method for converting a 3D model into multiple matrices to extract information related to the 3D model or its objects in an automated manner; the method is comprised of seven steps.

The first step is converting the surfaces of the 3D model into polygons wherein each polygon is assigned one or more IDs representing the objects of the 3D model that the polygon is located in. The second step is dividing the 3D model with groups of lines intersecting with each other in intersection points located in layers. The third step is determining the intersection nodes between the polygons and the lines of the groups of lines wherein each intersection node is assigned the IDs of the polygon that it is located in. The fourth step is conveying the IDs of each intersection node in a layer to the closest intersection point located in the same layer. The fifth step is forming a group of individual matrices for each layer wherein each individual matrix represents one type of polygons that are assigned the same ID and each cell of an individual matrix represents one of the intersection points and contains one ID corresponding to the intersection points. The sixth step is forming a collective matrix for each layer representing all types of polygons that carry different IDs wherein each cell of a collective matrix represents one of the intersection points and contains one or more IDs corresponding to the intersection points. The seventh step is accessing the cells of the groups of the individual matrices or the cells of the collective matrices to automatically extract information related to the objects of the 3D model.

Figure 1:
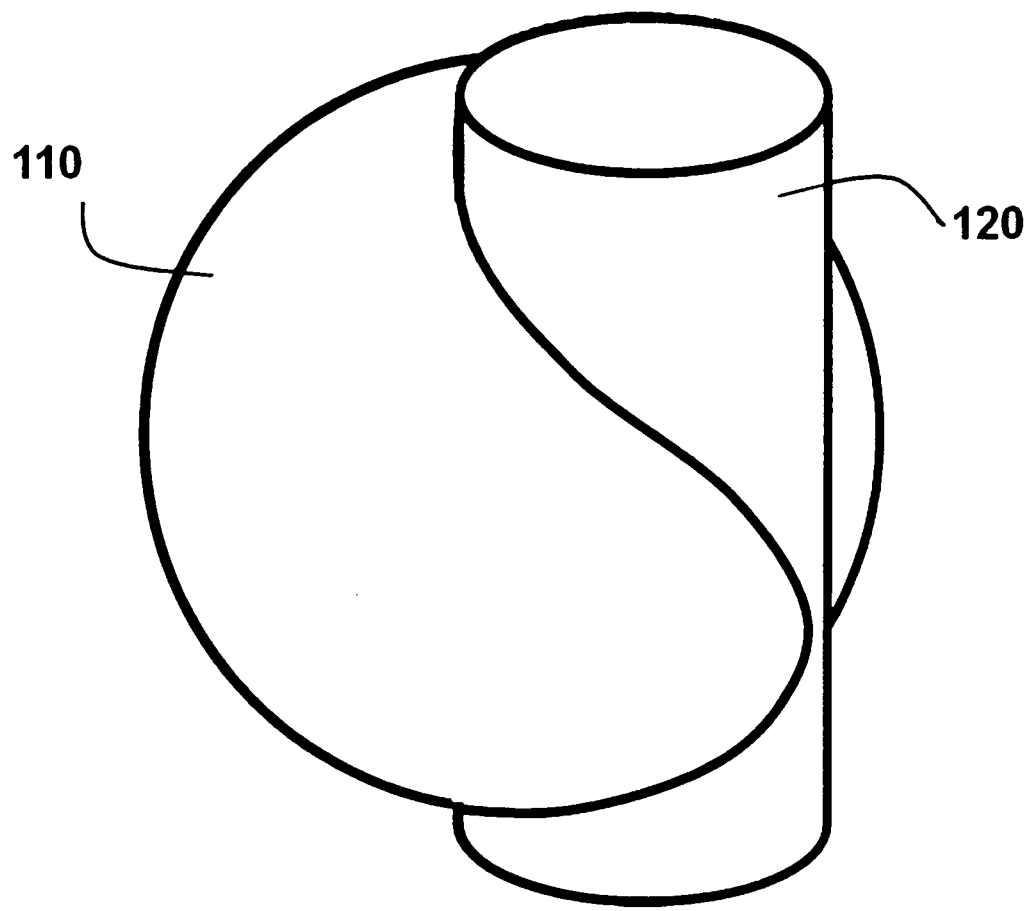
FIG. 1 illustrates a 3D model comprised of a first object in the form of a sphere and a second object in the form of a cylinder that are intersecting with each other.
Figure 2:
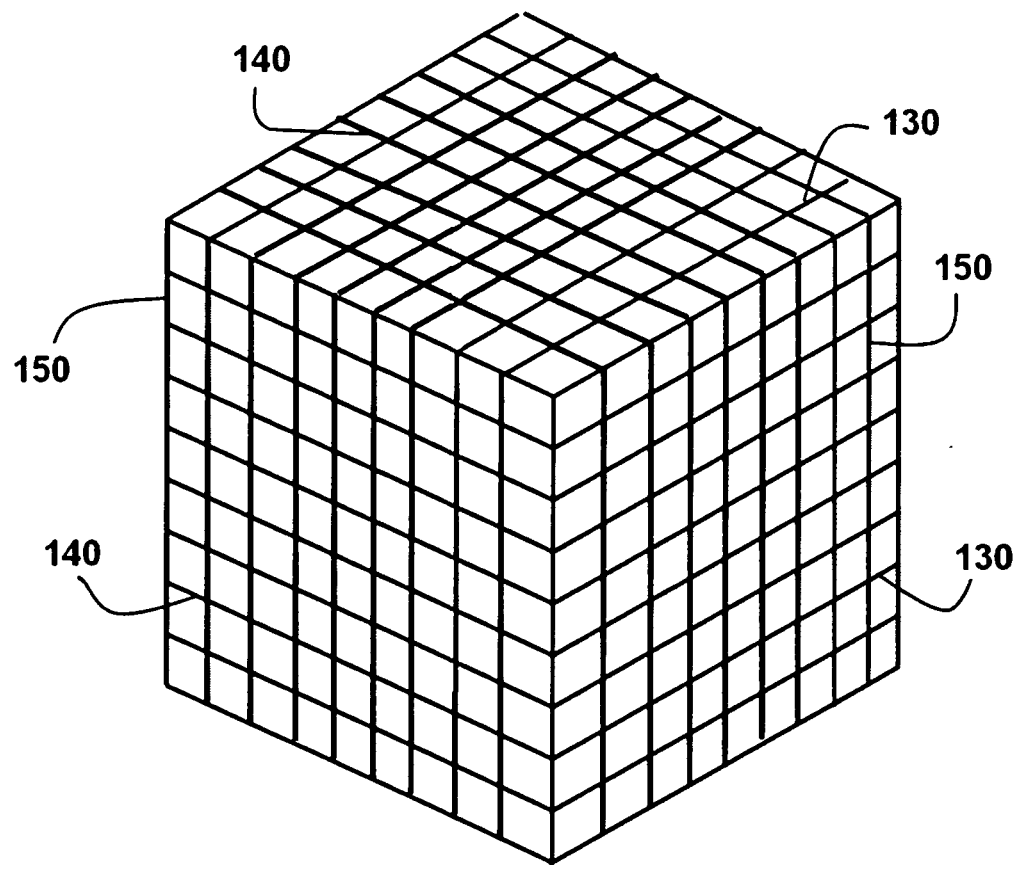
FIG. 2 illustrates three groups of lines parallel to the x-axis, y-axis, and z-axis and intersecting with each other at equal distances.
Figure 3:
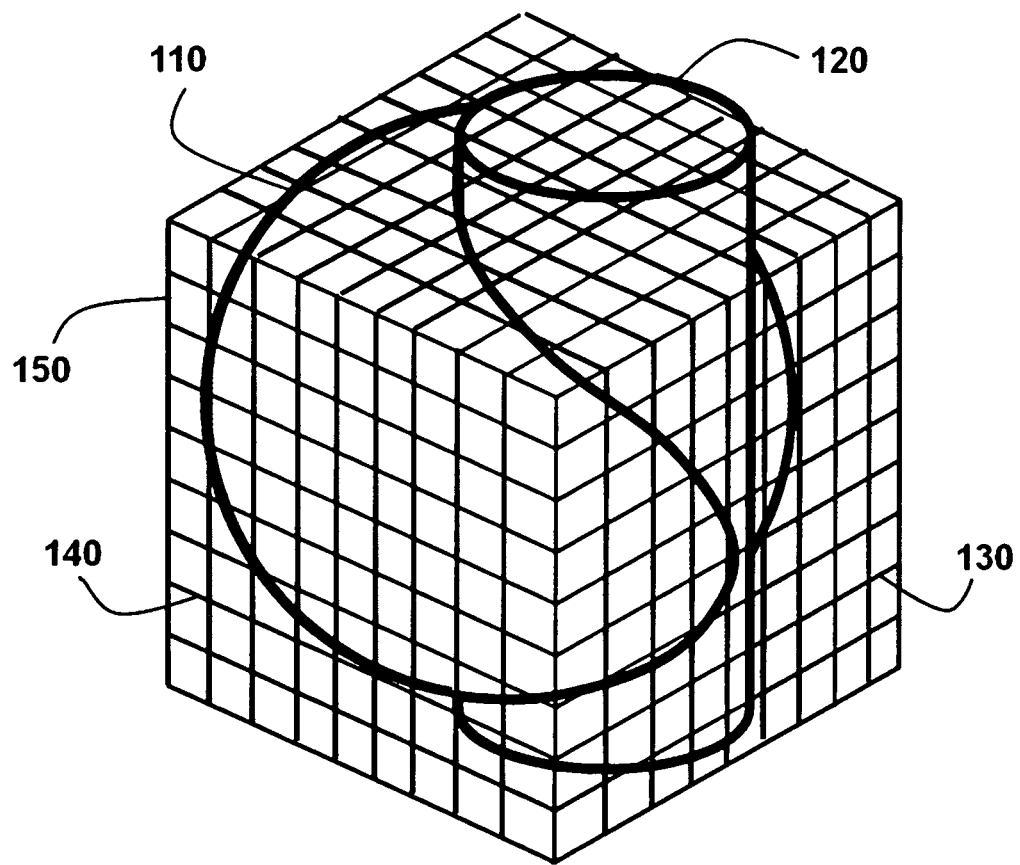
FIG. 3 illustrates positioning the 3D model to intersect completely with the three groups of lines.

To clarify the seven steps of the present invention, FIG. 1 illustrates a 3D model comprised of a first object 110 in the form of a sphere and a second object 120 in the form of a cylinder that are intersecting with each other. FIG. 2 illustrates a first group of lines 130 parallel to the x-axis, a second group of lines 140 parallel to the y-axis, and a third group of lines 150 parallel to the z-axis. The three groups of lines are positioned equally apart, horizontally and vertically, from each other to intersect together as shown in the figure. FIG. 3 illustrates relocating the 3D model to completely intersect with the three groups of lines. The number of lines of the three groups of lines may vary from one 3D model to another, but, in general, the number of lines for each group should be enough to cover the 3D model from all sides and accordingly each group may have a different number of lines. Also the equal distances between the lines of each group may vary from one 3D model to other to suit the details or the dimensions of the 3D model.

Figure 4:
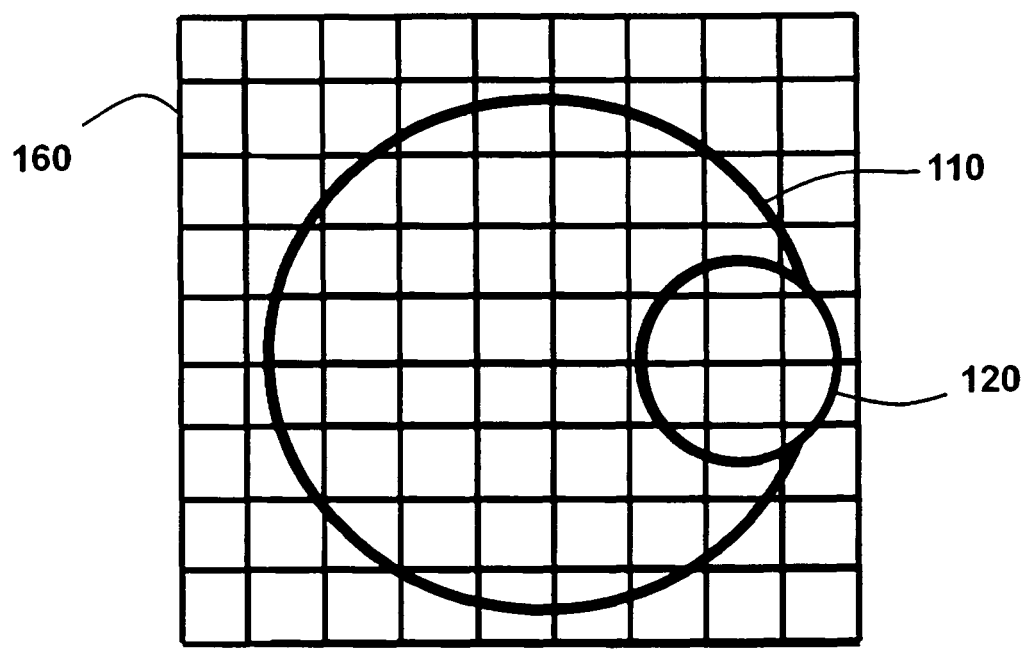
FIG. 4 illustrates a horizontal layer near the middle of the 3D model where the sphere and the cylinder sections appear as two circles.
Figure 5:
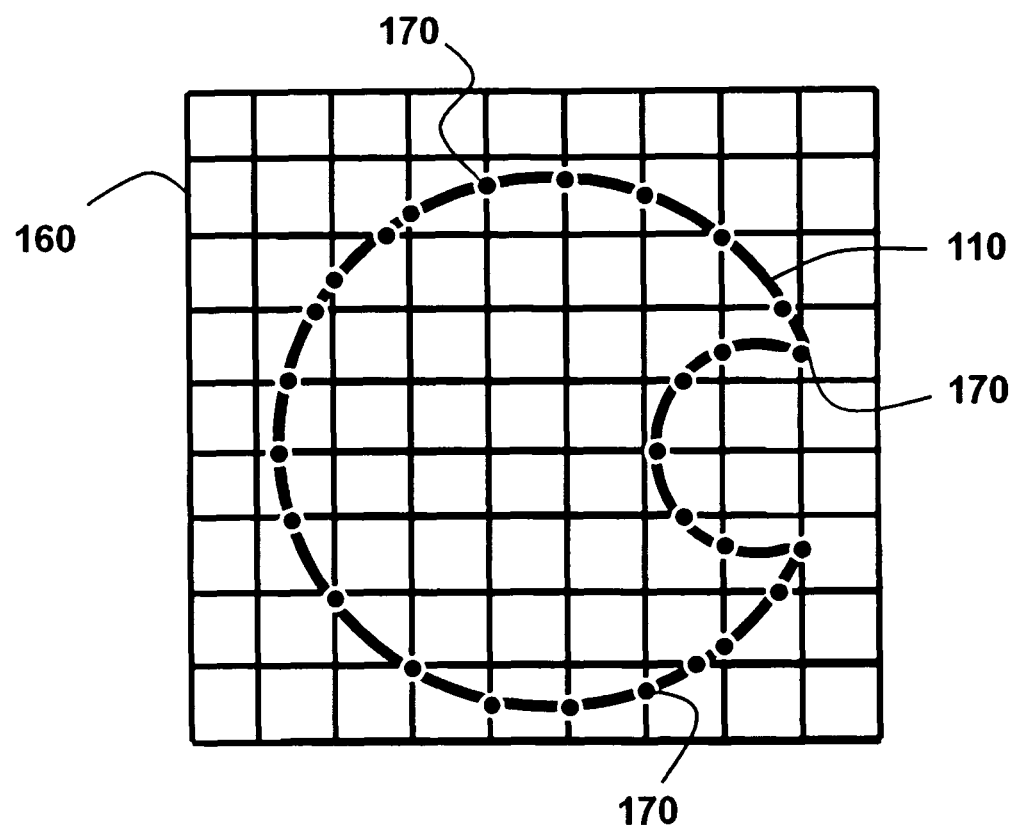
FIG. 5 illustrates the intersection nodes between the sphere and the three groups of lines at the horizontal layer.
Figure 6:
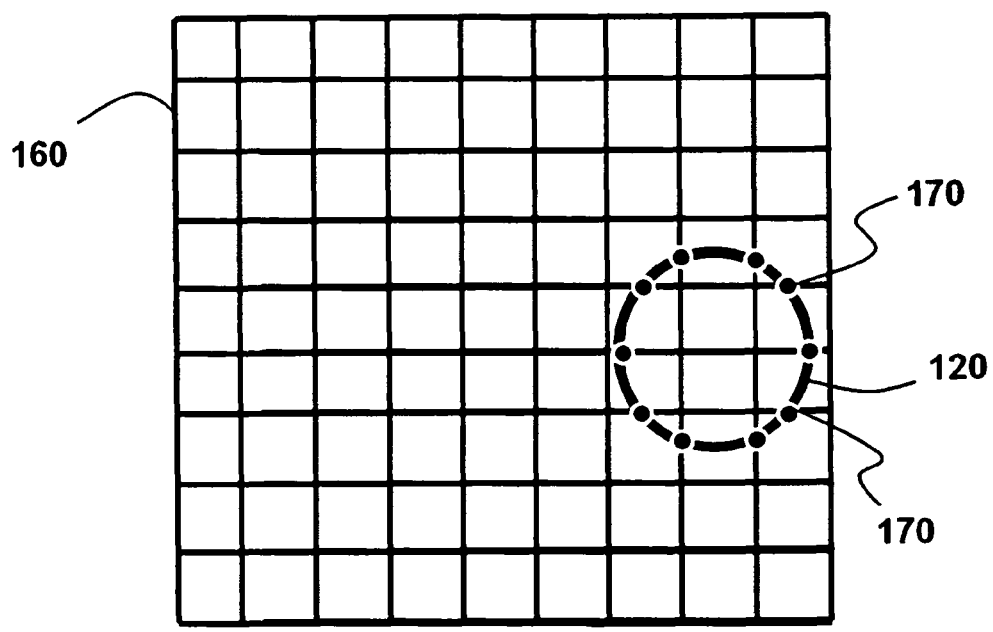
FIG. 6 illustrates the intersection nodes between the cylinder and the three groups of lines at the horizontal layer.

In FIG. 3 the number of lines in each group is 10 which leads to generating 10 horizontal layers parallel to the xy-plane, 10 vertical layers parallel to the xz-plane, and 10 vertical layers parallel to the yz-plane. FIG. 4 illustrates one of the horizontal layers 160 located near the middle of the 3D model where the sections of the sphere and the cylinder, at this layer, appear as two circles. FIG. 5 illustrates the section of the sphere alone on the horizontal layer while FIG. 6 illustrates the section of the cylinder alone on the horizontal layer. In FIGS. 5 and 6, the intersection nodes 170 are determined whereas the intersections nodes represent the intersections between the sphere or the cylinder with the lines of the three groups of lines at the horizontal layer. Assigning a unique identifier or ID to the sphere such as "S" and another unique identifier or ID to the cylinder such as "C" enables distinguishing between the sphere's intersection nodes and the cylinder's intersection nodes. This is achieved by assigning the identifier "S" of the sphere to each intersection node located on the sphere, and also assigning the identifier "C" of the cylinder to each intersection node located on the cylinder.

Figure 7:
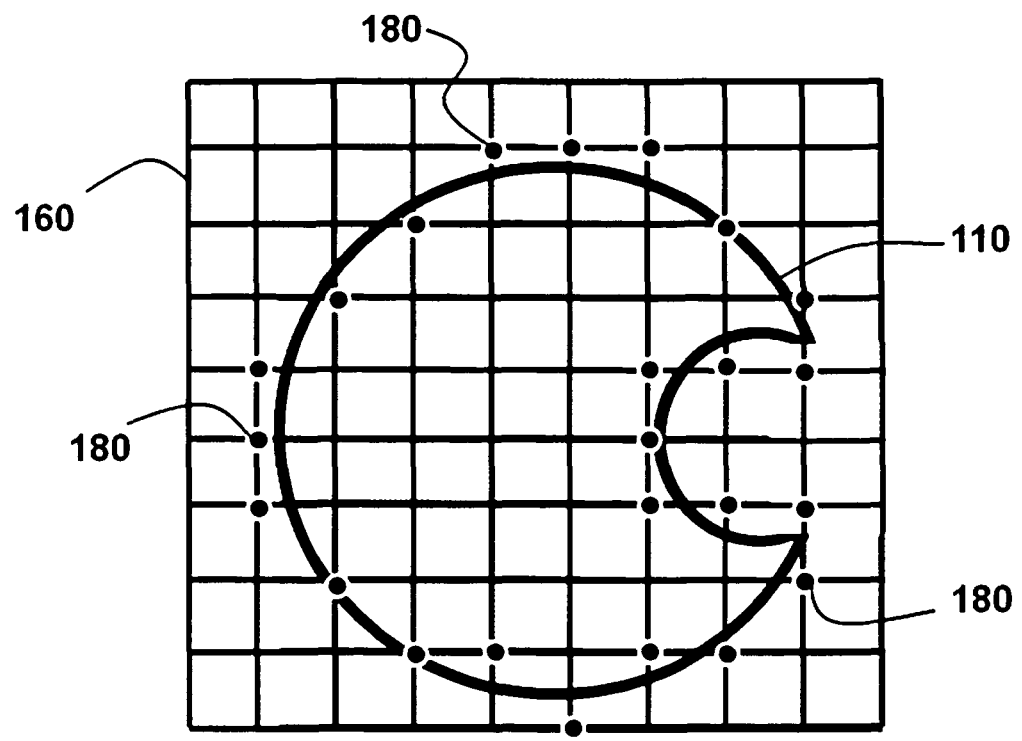
FIG. 7 illustrates assigning the ID of each intersection node of the sphere to the closest intersection point of the horizontal layer.
Figure 8:
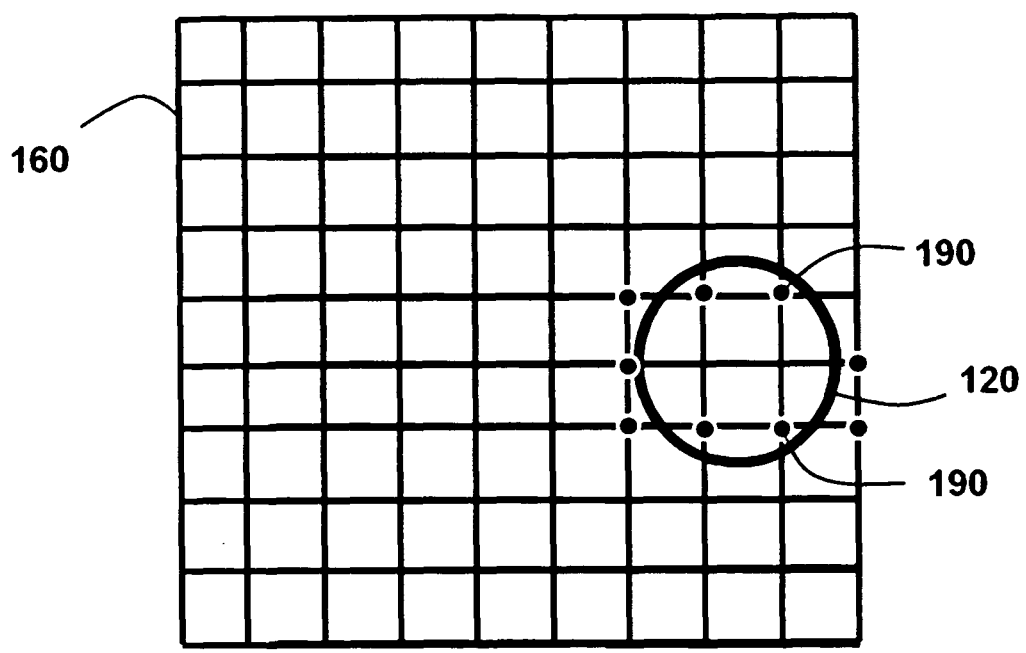
FIG. 8 illustrates assigning the ID of each intersection node of the cylinder to the closest intersection point of the horizontal layer.
Figure 10:
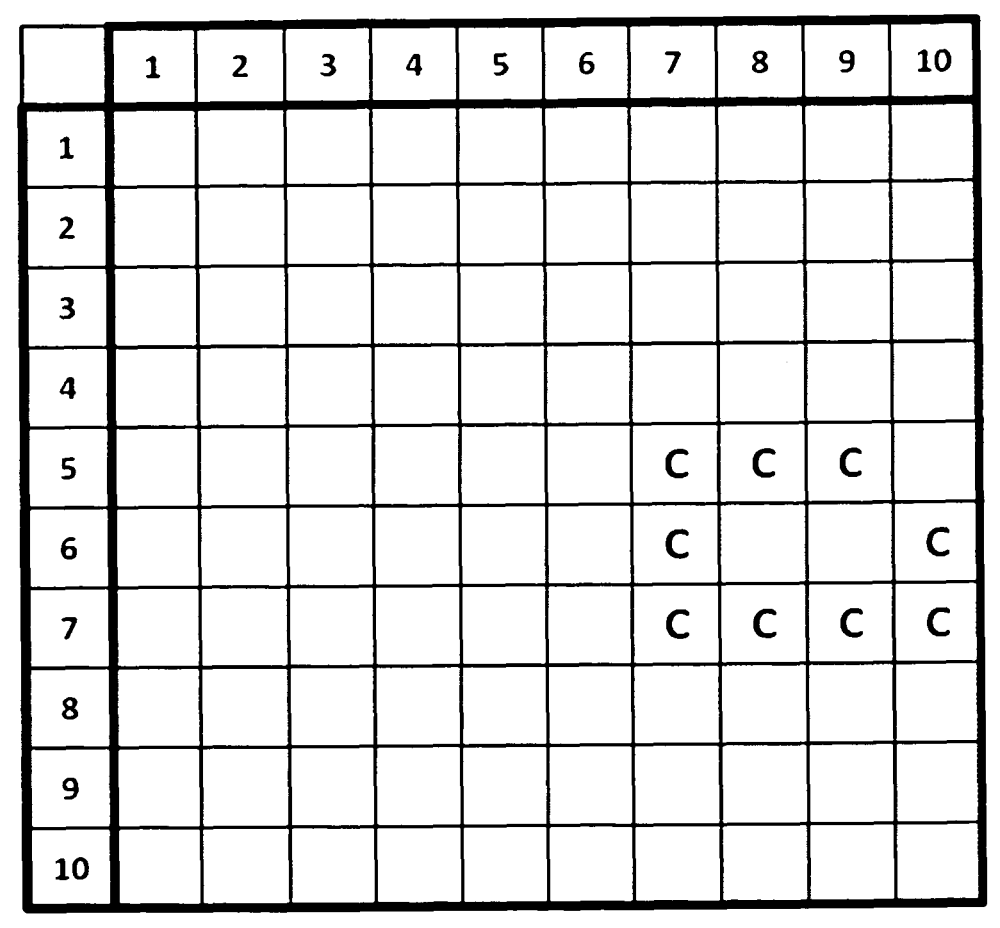

FIG. 7 illustrates assigning the identifier of each intersection node of the sphere to the closest intersection point 180 in the horizontal layer. Also FIG. 8 illustrates assigning the identifier of each intersection node of the cylinder to the closest intersection point 190 in the horizontal layer. FIG. 9 illustrates forming an individual matrix representing the intersection points in the horizontal layer that carry the sphere's identifier where the other cells of the individual matrix are empty. Also FIG. 10 illustrates forming an individual matrix representing the intersection points in the layer that carry the cylinder's identifier where the other cells of the individual matrix are empty. FIG. 11 illustrates forming a collective matrix that combines the identifiers of the sphere and the cylinder in the same cell, in other words, adding the cells of FIG. 9 to the cells of FIG. 10. Accordingly, to this step or process, some cells in the collective matrix contain "S" only, some cells contain "C" only, and some other cells contain "S" and "C" together, while the rest of the collective matrix cells are empty.

Generally, the individual matrices and the collective matrix are generated for each horizontal layer and each vertical layer of intersection between the three groups of lines. Accessing the cells of the individual matrices and the collective matrices of the entire 3D model enables extracting useful information related to the 3D model or its objects in an automated manner. For example, to automatically locate the shared surfaces or common surfaces between the sphere and the cylinder, the cells of the collective matrix in each layer that contain the two identifiers "S" and "C" will be determined. These cells represent specific intersection points in each layer, which lead to the closest intersection nodes of the sphere and cylinder that already conveyed their identifiers to these intersection points. Identifying such intersection nodes on the sphere and the cylinder identifies common points between the sphere and the cylinder. Connecting between these points determines the common polygons or surfaces between the sphere and the cylinder.

In another example, if it is required to automatically calculate the volume of the part of the sphere that appears in the 3D mode. In this case, the intersection nodes of the sphere in each layer are identified by finding the intersection points in the cells of all individual matrices' cells that contains "S". As mentioned previously, such intersection points lead to the intersection nodes that already conveyed their IDs to these intersection points. Connecting between each two successive intersection nodes in a layer forms a boundary line of a section for the sphere at each layer. Calculating the perimeter of each boundary lines of a section at each layer then multiplying this perimeter by a unit value leads to obtaining the volume of the sphere, whereas the unit value is the height between each two successive layers. Generally, it is important to note that the same algorithm used for finding the sphere volume can be used to calculate the volume of the cylinder or any other object in a 3D model. In other words, similar requests can be achieved using similar algorithms, regardless of the differences between various 3D models.

In another example, it may be required to determine the points of the sphere that have a direct horizontal or vertical view to the cylinder. In other words, the sphere points that can directly get connected to a cylinder point by a horizontal line or a vertical line. To achieve this, first determine the cells of the collective matrix in each horizontal layer and vertical layer that contain "S" followed by one or more empty cells then followed by a cell containing "C" in the up, down, left, or right directions. Identifying such cells identifies the corresponding intersection points which lead to identifying the corresponding intersection nodes of these intersection points. Such intersection nodes and other points located in between them on the sphere's surface allocate the points of the sphere that have a direct horizontal or vertical view to the cylinder.

In yet another example, it may be required to determine the points of the sphere and the cylinder that have a direct westwardly view, wherein the westward direction is assumed to be located on the left side of the 3D model or the figure. In this case, first determine the cells in each collective matrix of a horizontal layer that contain "S" or "C" and have empty cells on their left sides up to the first column of the collective matrix. Identifying these cells identifies the corresponding intersection points which consequently identify the corresponding intersection nodes. The list of such intersection nodes on the sphere's surface—in addition to the points on the sphere's surface that are located between them—allocates the points on the sphere that have a direct westwardly view. Also the list of such intersection nodes on the cylinder's surface—in addition to the points on the cylinder's surface that are located between them—allocates the points on the cylinder that have a direct westwardly view. Using a similar algorithm, the points that have a direct view to the North, South, or East or to any other specific directions can be identified.

Figure 12:
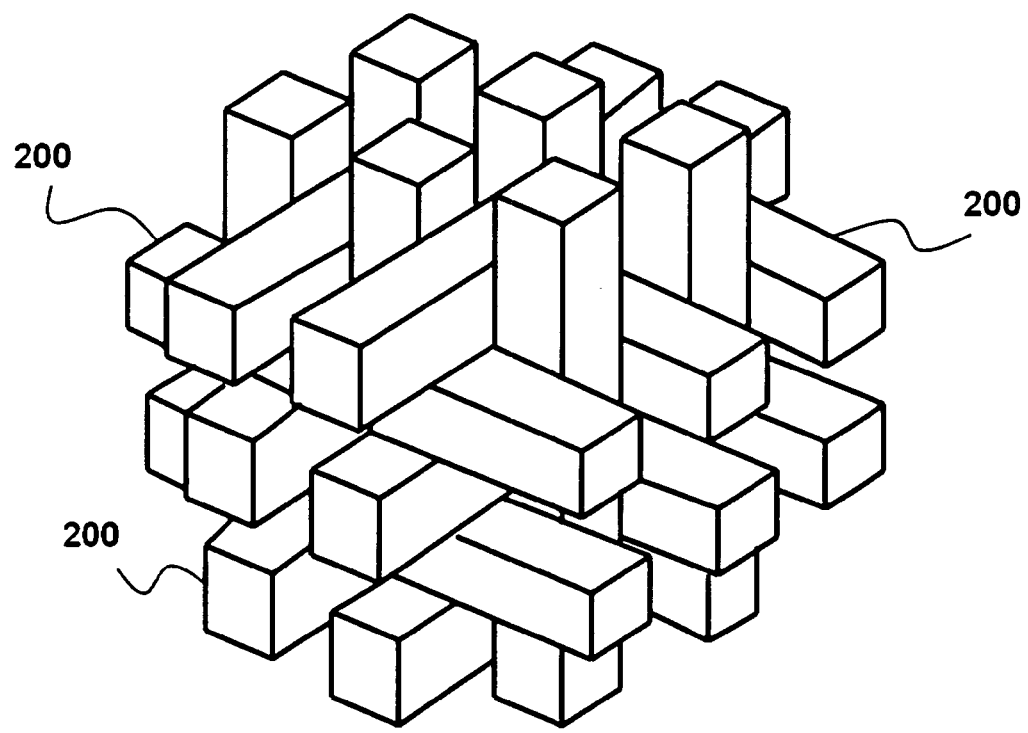
FIG. 12 illustrates a complex 3D model comprised of a plurality of combined prisms.

Generally, the analysis of the individual matrices and/or the collective matrices of the 3D model enables extracting information related to the 3D model or its objects in an automated manner regardless of the simplicity or complexity of the 3D model. For example, FIG. 12 illustrates a complex 3D model comprised of a plurality of prisms 200 combined with each other in a complex manner. To find the surfaces of a prism that are completely surrounded by other prisms, first, find the cells of the collective matrix of each horizontal layer and vertical layer that contain a prism identifier attached to another cell containing another prism identifier. These cells lead to the intersection points which correspond to a list of intersection nodes located on a prism and that are completely surrounded by another prism. Identifying the areas between these intersection points allocates the surfaces of a prism that is completely surrounded by another prism.

Figure 13:
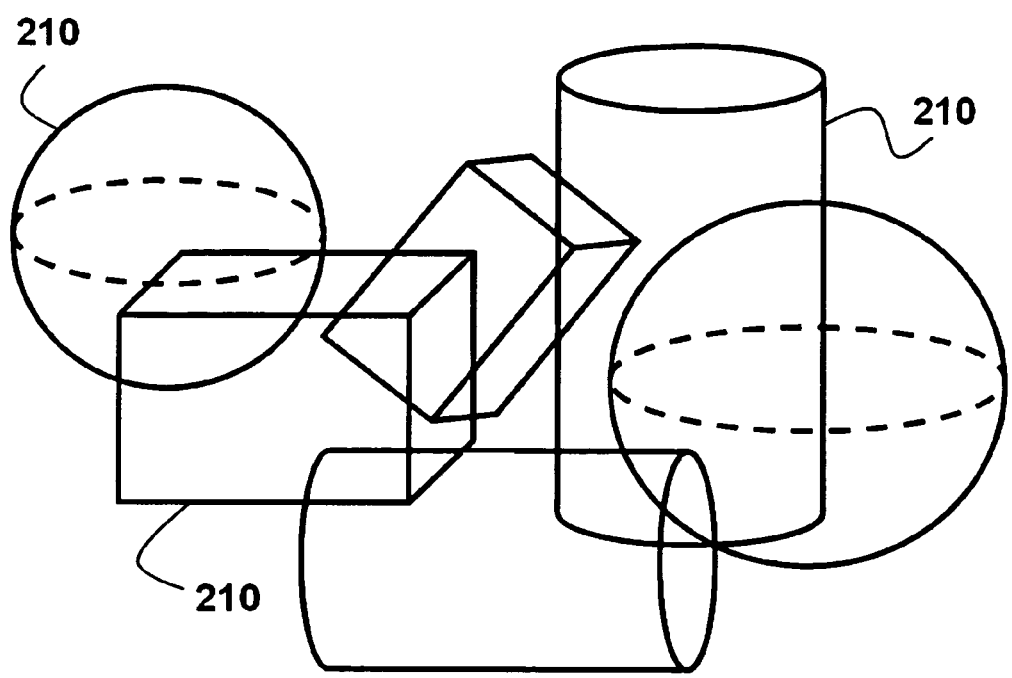
FIG. 13 illustrates a 3D model created by combining or de-combining a set of simple objects using constructive solid geometry.
Figure 14:
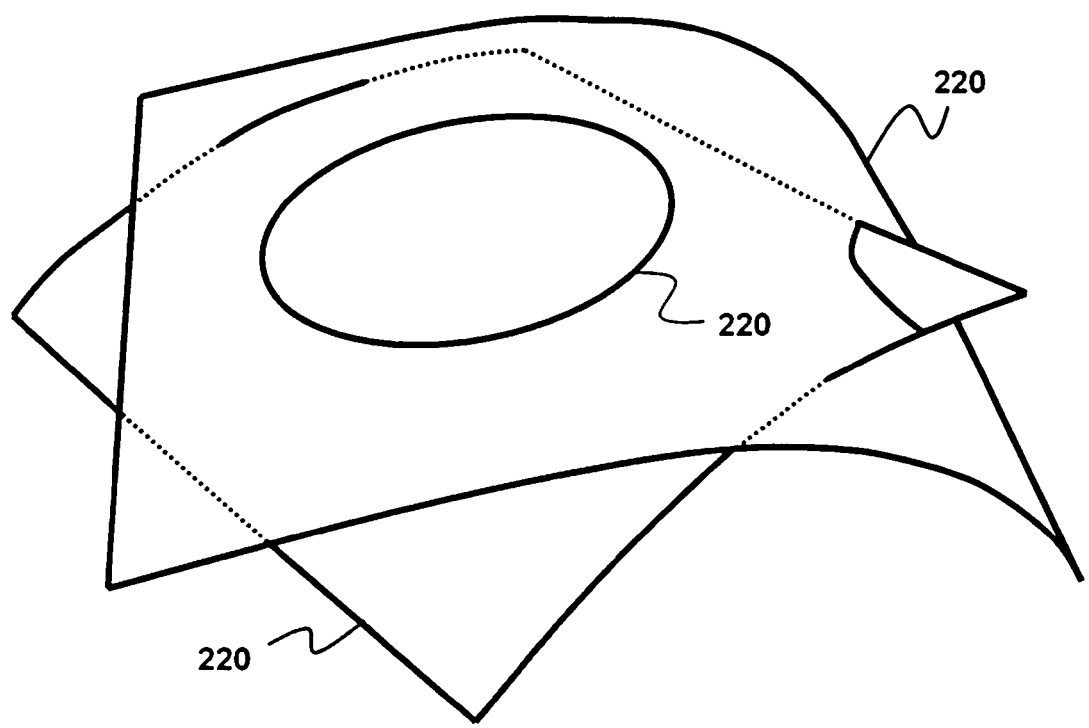
FIG. 14 illustrates a 3D model created by a plurality of curves using the NURBS modeling technique.
Figure 15:
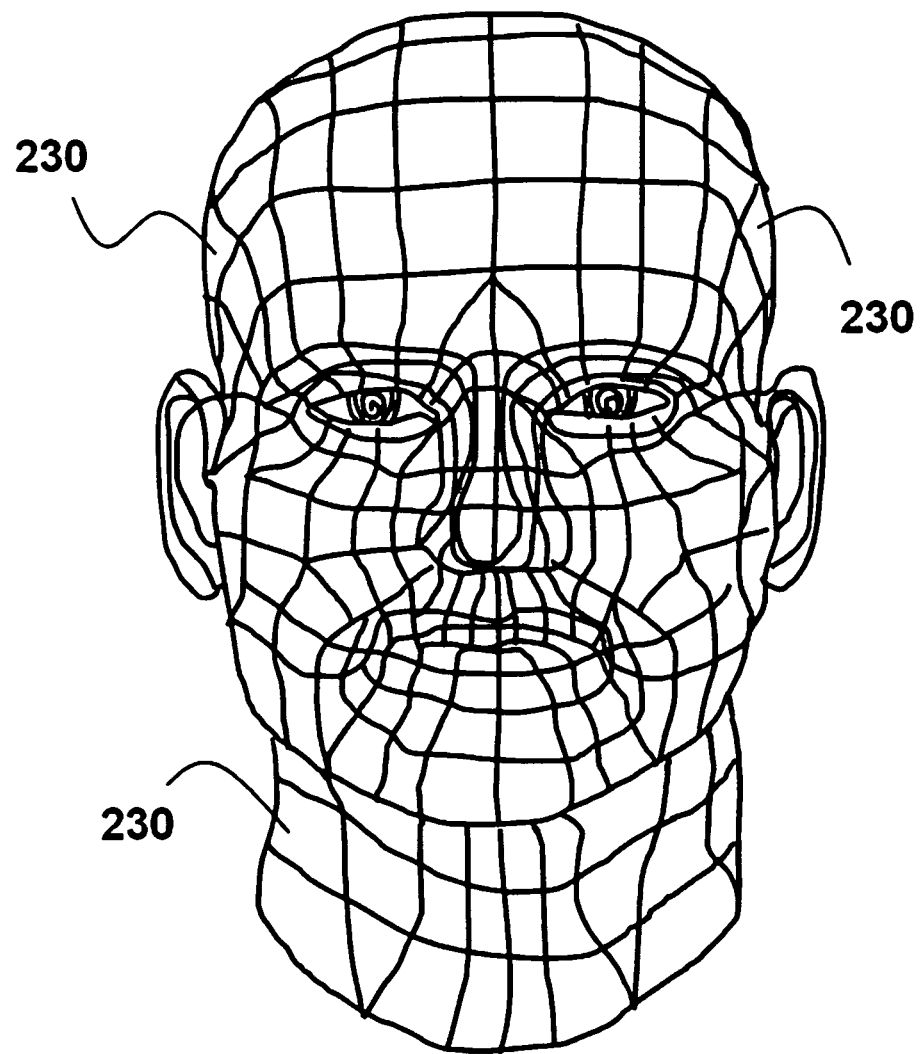
FIG. 15 illustrates a 3D model comprised of a plurality of polygons approximating the surfaces of a human's head using the polygonal modeling technique.
Figure 16:
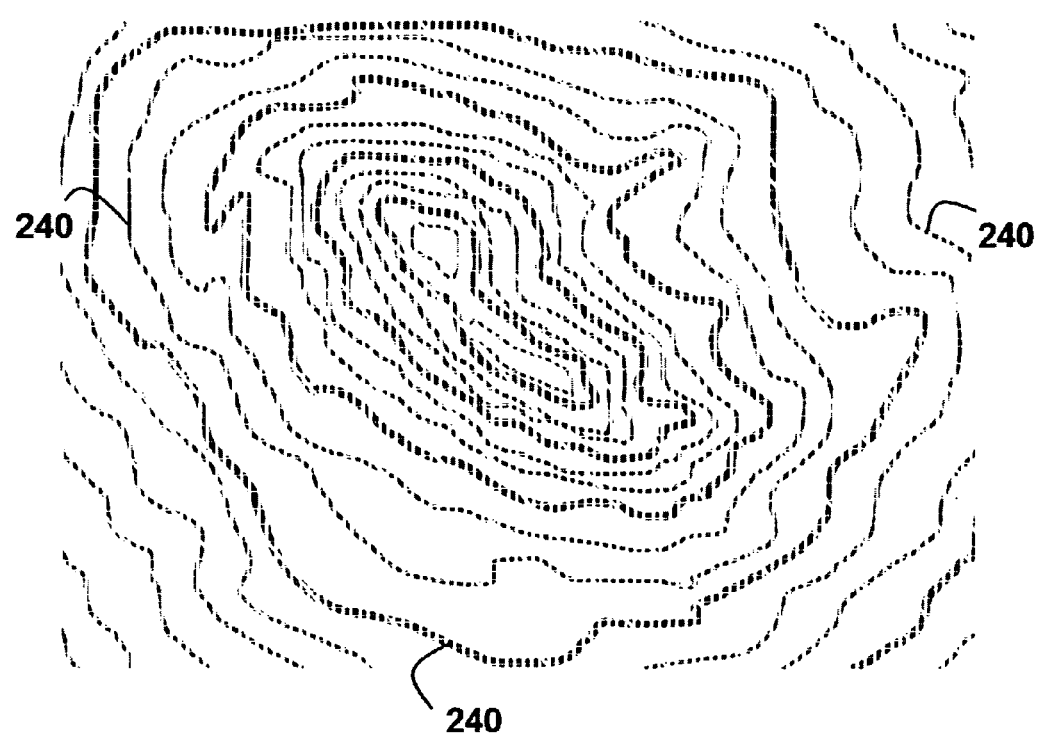
FIG. 16 illustrates a top view of a 3D model representing the contour lines of a mountain using the point cloud technique.

FIG. 13 illustrates a 3D model created by combining or de-combining a set of simple objects 210 using constructive solid geometry. FIG. 14 illustrates a 3D model created by a plurality of curves 220 using the NURBS modeling technique. FIG. 15 illustrates a 3D model comprised of a plurality of polygons 230 approximating the surfaces of a human's head using the polygonal modeling technique. FIG. 16 illustrates a top view of a 3D model representing the contour lines 240 of a mountain using the point cloud technique. In all such cases or examples the present invention converts the surfaces of the 3D model with a plurality of polygons or triangles where the intersections between the polygons or triangles with the groups of lines are calculated to allocate the intersection nodes as was previously described. However, it is important to note that, in some cases, the intersection nodes are directly located on the intersection points, whereas that happens when the surfaces of the 3D model are parallel to the groups of lines.

In another embodiment of the present invention, assigning the IDs to the polygons is done both manually or automatically. To be achieved manually, the user selects a polygon or a group of polygons on the computer screen and assigns a unique ID to them. To be achieved automatically, either each object that forms an enclosure is automatically given a unique ID, or each group of attached polygons that forms a certain configuration is automatically given a unique ID. Such configurations can be listed in a database that assigns and stores a unique ID to each unique configuration of said attached polygons. Using this database enables assigning a unique ID to each object in the 3D model.

In one embodiment of the present invention, the ID or identifier of a polygon may represent multiple classifications. For example, in a 3D model representing a plurality of buildings where each building contains a plurality of rooms, and each room contains a number of different walls. In this case, if each building has a number, and each room has a name, and each wall has a type, then the ID of a polygon in this 3D model will represent the building number, the room name, and the wall type. This way, the method of the present invention can simply extract classified information related to the buildings, rooms, or walls of the 3D model.

Figure 17:
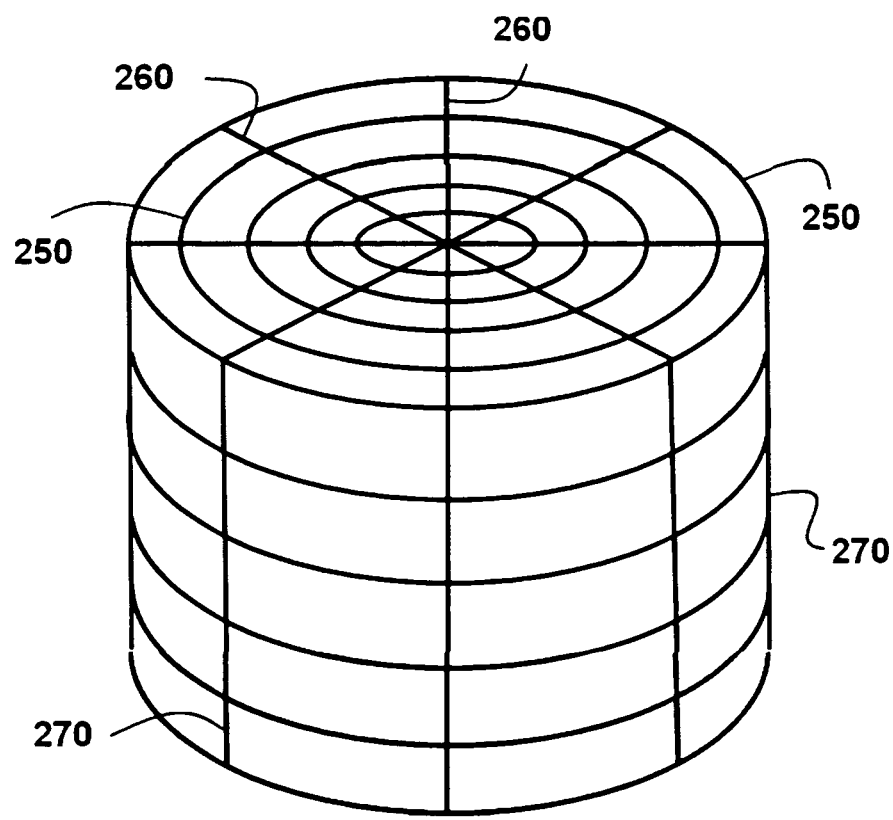
FIG. 17 illustrates an example of three groups of intersecting lines forming a cylindrical pattern.
Figure 18:
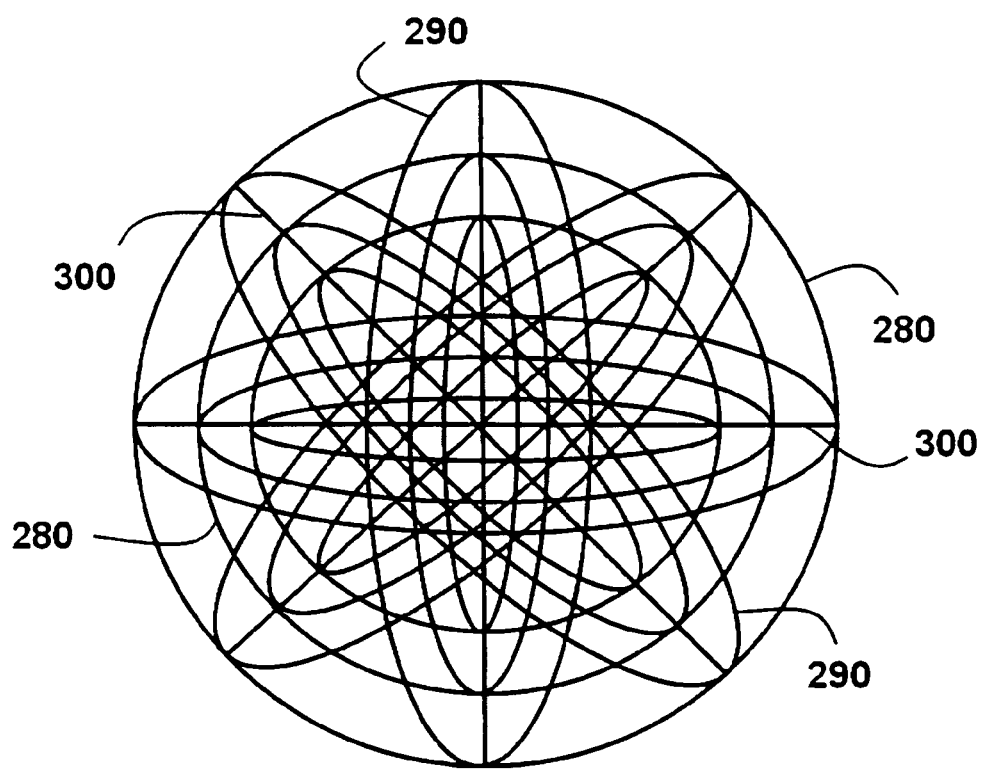
FIG. 18 illustrates an example of another three groups of intersecting lines forming a spherical pattern.
Figure 19:
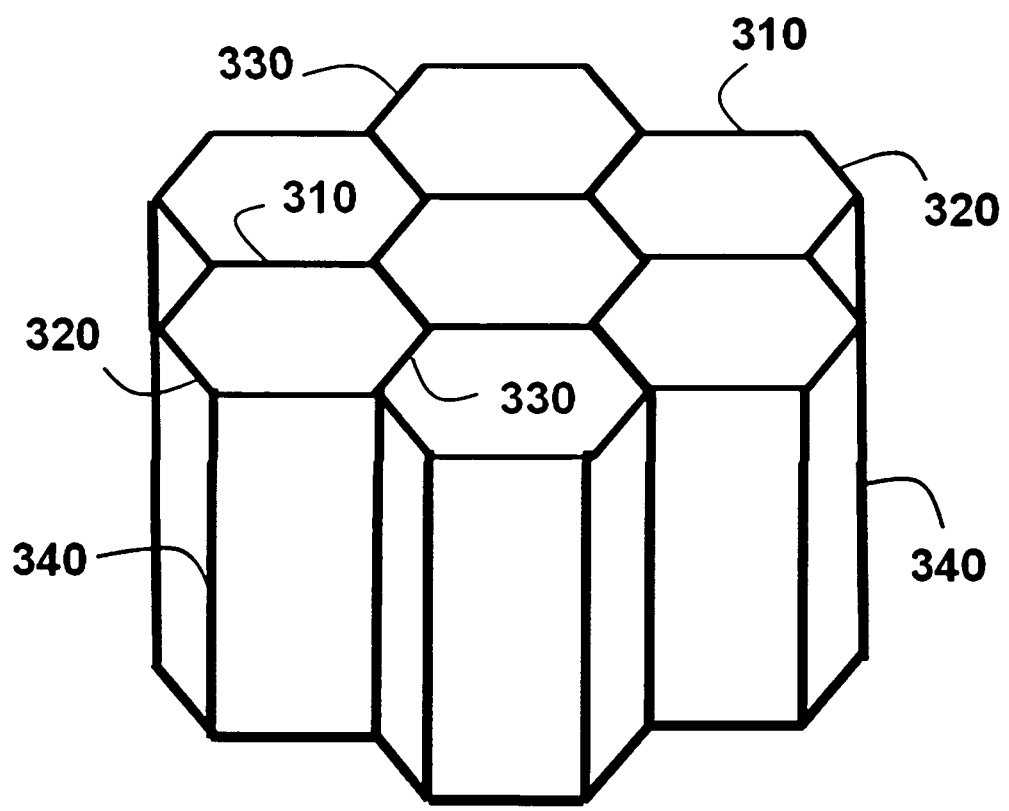
FIG. 19 illustrates an example of four groups of intersecting lines forming a hexagonal pattern.

In another embodiment of the present invention, dividing the 3D model is achieved by three groups of lines parallel to the x-axis, y-axis, and z-axes, or achieved by three or more groups of lines parallel to directions other than the x-axis, y-axis, and z-axes. For example, FIG. 17 illustrates three groups of lines, in a circular direction 250, radial direction 260, and vertical direction 270 intersecting with each other to form a cylindrical pattern. FIG. 18 illustrates three groups of lines, in a circular direction 280 and 290, and a radial direction 300 intersecting with each other to form a spherical pattern. FIG. 19 illustrates four groups of lines 310-340 intersecting with each other to form a hexagonal pattern.

Figure 20:
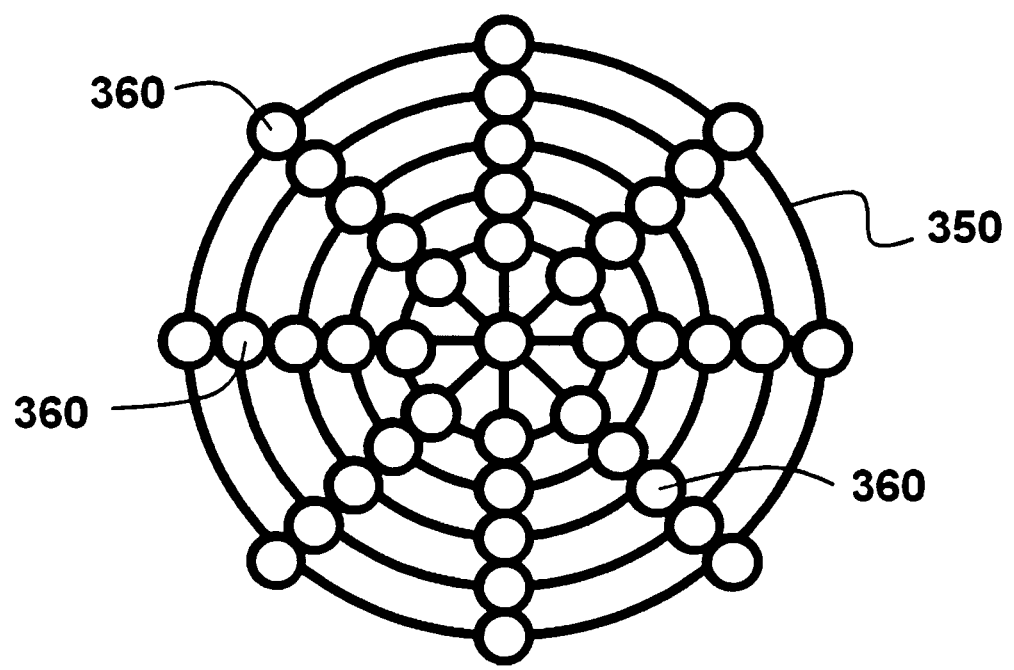
FIG. 20 illustrates forming an individual matrix or a collective matrix to match the cylindrical pattern of the intersecting lines.
Figure 21:
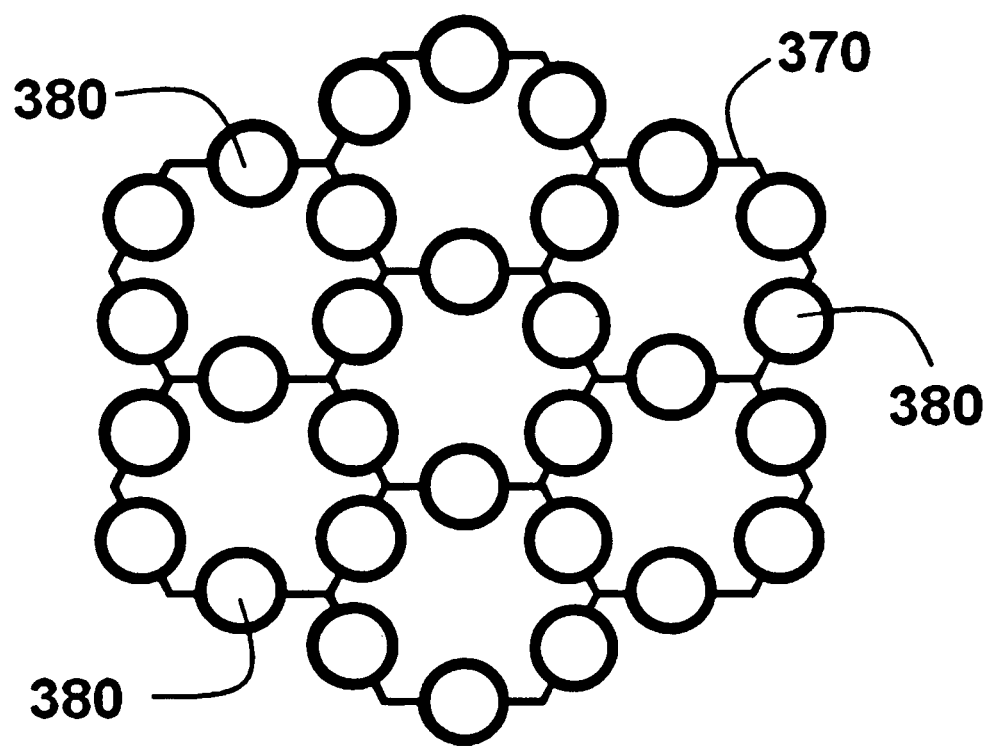
FIG. 21 illustrates forming an individual matrix or a collective matrix to match the hexagonal pattern of the intersecting lines.

In all such cases, the individual matrices and the collective matrices are formed to match the pattern of the intersecting lines. This is to facilitate the analysis of the matrices' cells relative to the 3D model. For example, FIG. 20 illustrates the pattern 350 of the individual and collective matrices that were formed from the intersecting lines of FIG. 17. In this case, the arrangements of the matrix cells 360 match the arrangement of the intersections between the lines of the cylindrical pattern. Also FIG. 21 illustrates the pattern 370 of the individual and collective matrices that were formed from the intersecting lines of FIG. 19. In this case, the arrangements of the matrix cells 380 match the arrangement of the intersections between the lines of the hexagonal pattern.

Accessing or analyzing the cells of the individual matrices and/or the cells of the collective matrices is done to extract information related to the 3D model or its objects. In one embodiment of the present invention, the extracted information represents the identity of the 3D model or its objects. In another embodiment of the present invention, the extracted information represents numerical values for lengths, perimeters, areas, or volumes related to the 3D model or its objects. In another embodiment of the present invention, the extracted information represents positional information describing the locations of the objects of a 3D model relative to each other. In yet another embodiment of the present invention, the extracted information represents checking the compliance of the 3D model against certain rules, codes, or requirements.

Figure 22:
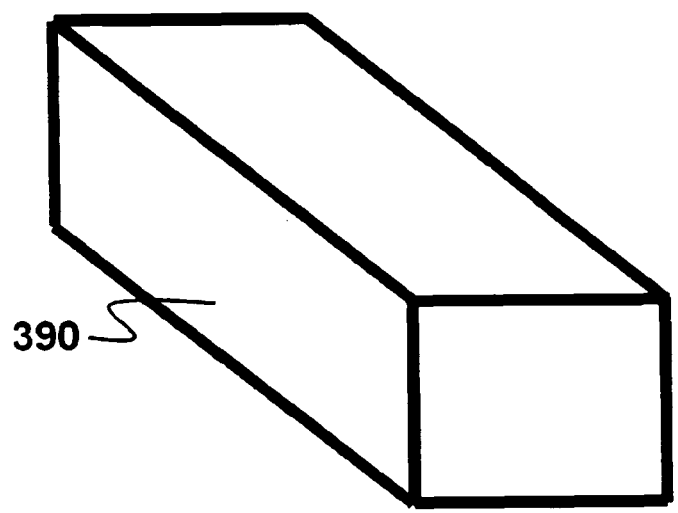
FIGS. 22 to 25 illustrate a 3D model sliced in three different directions parallel to the xy-plane, the xz-plane, and the yz-plane.
Figure 23:
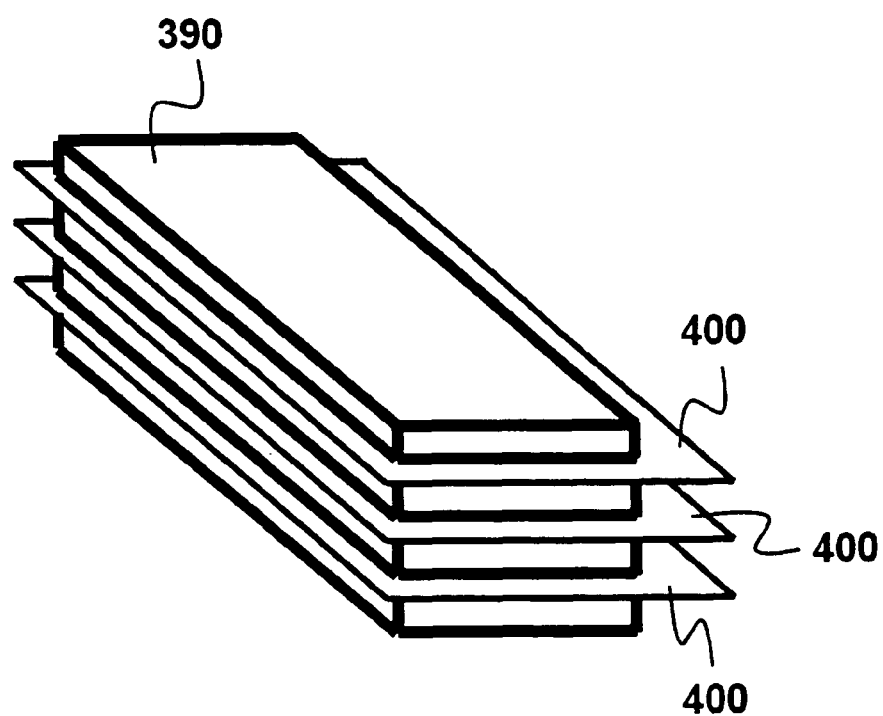
Figure 24:
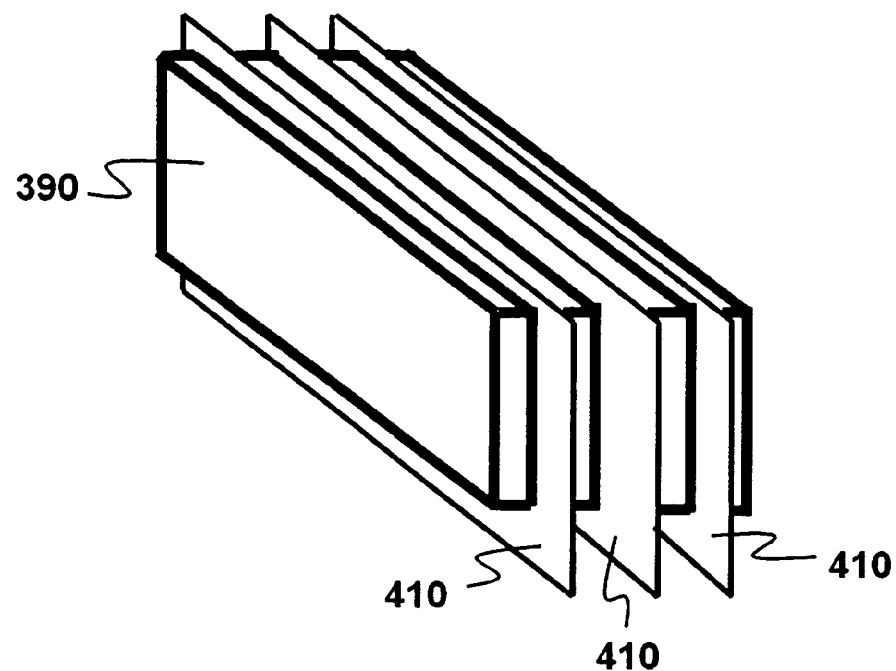
Figure 25:
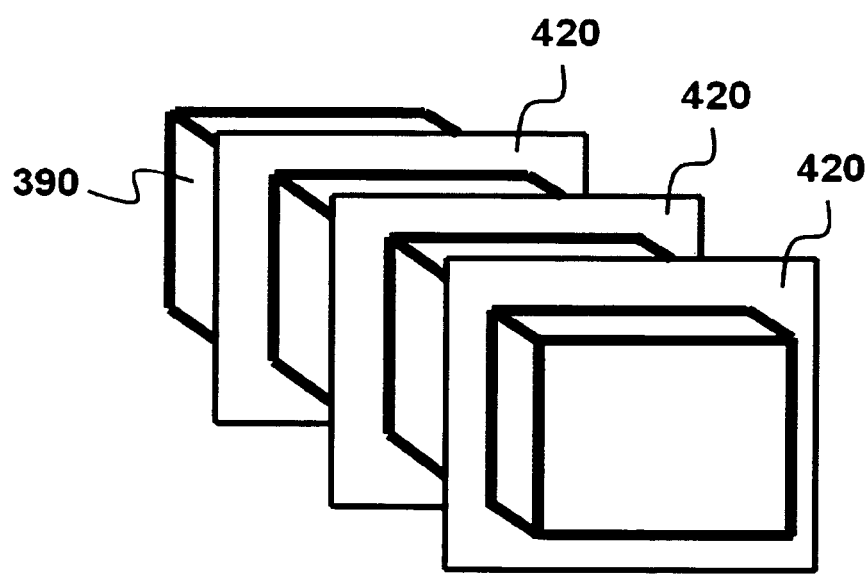

It is important to note that, in some cases of 3D models, slicing the 3D model by a plurality of horizontal layers only, or by a plurality of vertical layers only, is enough to apply the method of the present invention on the 3D model. For example, FIG. 22 illustrates an example of a 3D model 390, while FIG. 23 illustrates slicing the 3D model in one direction 400 parallel to the xy-plane creating a number of sections parallel to the xy-plane. In this case, each section is comprised of lines that can be represented according to a vector graphics format, where forming individual matrices and collective matrices representing the lines at each section is enough to apply the method of the present invention on the 3D model. FIG. 24 illustrates slicing the 3D model in one direction 410 parallel to the yz-plane creating a number of sections parallel to the yz-plane where these sections are enough to apply the method of the present invention on the 3D model. The same process applies on FIG. 25 where the 3D model is sliced in one direction 420 parallel to the xz-plane.

According to such cases, in one embodiment, the present invention discloses a method for converting a 3D model into multiple matrices to extract information related to the 3D model or its objects in an automated manner, the is comprised of five steps: the first step is slicing the 3D model into multiple sections parallel to each other to create a plurality of lines in each section, represented according to a vector graphics format; the second step is assigning an ID to each line representing the object of the 3D model that the line is located in; the third step is forming a group of individual matrices for each section wherein each individual matrix represents one set (type) of lines that are assigned the same ID and located at the same section and each cell of the individual matrix represents a point of a line and contains one ID corresponding to the line that the point is located in; the fourth step is forming a collective matrix for each section representing all types of lines that are located at the same section and carry different IDs, wherein each cell of the collective matrix represents a point of a line and contains one or more IDs corresponding to the lines that the point is located in; and the fifth step is accessing the cells of the individual matrices or the cells of the collective matrices to extract specific information about the 3D model or the objects of the 3D model.

Generally, the 3D models described in the previous examples are represented according to a vector graphics format, wherein none of the polygons of the 3D models contains a colored pixel, and no colored pixels are present between the boundary lines of the polygons. However, in cases where the 3D model is represented by a set of points using the point cloud technique, these sets of points are converted into a plurality of triangles, as known in the art, wherein the method of the present invention can be utilized with the triangles. Also if the 3D model is represented according to a raster graphics format, then an edge detection program is utilized to detect the edges of the 3D model and convert them into lines wherein each two lines that meet at one point are converted into a triangle. Accordingly, the 3D model can be recreated by a plurality of triangles wherein the method of the present invention can be utilized with the triangles.

Conclusively, while a number of example embodiments have been presented in the description of the present invention, it should be understood that a vast number of variations exist, and these example embodiments are merely representative in nature, and are not intended to limit the scope, applicability or configuration of the disclosure in any way. Variations of the above-disclosed and other features and functions, or alternatives thereof, may be combined into many other different systems or applications. Various presently unforeseen or unanticipated alternatives, modifications, or improvements therein or thereon may be subsequently made by those skilled in the art which are also intended to be encompassed by the claims below. Therefore, the foregoing description provides those of ordinary skill in the art with a convenient guide for implementation of the disclosure and contemplates that various changes in the functions and arrangements of the described embodiments may be made without departing from the spirit and scope of the disclosure defined by the claims thereto.

The invention claimed is:

1. A method for converting a 3D model into multiple matrices to extract information related to the 3D model wherein the 3D model comprises a plurality of polygons according to a vector graphics format and the method comprises:
    assigning each polygon of the 3D model one or more identifiers ("IDs") representing one or more objects of the 3D model that the polygon is located in;
    dividing the 3D model by a plurality of lines located in layers parallel to the xy-plane, the xz-plane, and the yz-plane, wherein each intersection between three lines of the plurality of lines represents an intersection point, and each intersection between a line of the plurality of lines and a polygon represents an intersection node that is assigned the same ID of the polygon;
    for each one of the intersection nodes, determining a closest one of the intersection points and assigning the ID of the intersection node to the closest one of the intersection points;
    forming a group of individual matrices for each one of the layers wherein each individual matrix represents one type of the polygons that are assigned a same ID and located at the same layer, and each cell of the individual matrix represents one of the intersection points and contains one ID corresponding to the intersection points;
    forming a collective matrix for each one of the layers representing all types of the polygons that are located at the same layer and carry different IDs, wherein each cell of the collective matrix represents one of the intersection points and contains one or more IDs corresponding to the intersection points; and
    accessing the cells of the individual matrices or the cells of the collective matrices to extract specific information about the objects or the 3D model.

2. The method of claim 1 wherein said 3D model is created by combining or de-combining a set of simple objects that are comprised of a plurality of polygons according to a vector graphics format.

3. The method of claim 1 wherein said 3D model is created by a plurality of curves to represent a freeform surface that can be converted into a plurality of polygons according to a vector graphics format.

4. The method of claim 1 wherein said 3D model is created by a set of data points that can be converted into a plurality of polygons according to a vector graphics format.

5. The method of claim 1 wherein said 3D model is created according to a raster graphics format and converted into a plurality of polygons according to a vector graphics format using an edge detection program.

6. The method of claim 1 wherein said IDs are manually assigned to said objects by selecting and tagging each one of said objects with a unique ID on a computer display.

7. The method of claim 1 wherein said IDs are automatically assigned to said polygons by giving a unique ID to each group of said polygons that form one enclosure.

8. The method of claim 1 wherein said IDs are automatically assigned to said polygons by giving a unique ID to each group of said polygons that form a configuration that has certain attributes.

9. The method of claim 1 wherein each object of said objects has multiple classifications represented in said one or more identifiers.

10. The method of claim 1 wherein said lines are not parallel to one or more of the xy-plane, the xz-plane, and the yz-plane.

11. The method of claim 1 wherein said lines are circles, ellipses, or curves.

12. The method of claim 1 wherein said individual matrices and said collective matrices are formed to match the pattern of intersections of said plurality of lines.

13. The method of claim 1 wherein said specific information representing numerical information related to said objects or said 3D model such as lengths, areas, or volumes.

14. The method of claim 1 wherein said specific information representing positional information describing the locations of said objects relative to each other.

15. The method of claim 1 wherein said specific information representing the identity of said objects by comparing the attributes of said objects with a database that assigns a unique identity with each unique attributes of an object.

16. The method of claim 1 wherein said specific information representing the identity of an object of said objects by comparing the parameters of said object with similar parameters of another 3D model of an object that has a known identity.

17. The method of claim 1 wherein said specific information representing the compliance of said objects or said 3D model against a set of rules, codes, or requirements.

18. The method of claim 1 wherein said polygons are directly located on said layers.

19. The method of claim 1 wherein said intersection nodes are directly located on said intersection points.

20. A method for converting a 3D model into multiple matrices to extract information related to the 3D model wherein the 3D model comprises a plurality of polygons according to a vector graphics format and the method comprises:

slicing the 3D model into multiple sections parallel to each other to create a plurality of lines in each section;

assigning an identifiers ("IDs") to each line of said lines representing the object of the 3D model that the line is located in;

forming a group of individual matrices for each section wherein each individual matrix represents one type of lines that are assigned a same ID and located in the same section wherein each cell of the individual matrix represents a point of a line and contains one ID corresponding to the line that the point is located in;

forming a collective matrix for each section representing all types of lines that are assigned different IDs and located in the same section wherein each cell of the collective matrix represents a point located on one or more lines and contains one or more IDs corresponding to the one or more lines that the point is located in; and accessing the cells of the individual matrices or the cells of the collective matrices to extract specific information about the objects or the 3D model.

* * * * *